United States Patent [19]

Kaise et al.

[11] Patent Number: 5,562,004
[45] Date of Patent: Oct. 8, 1996

[54] METHOD FOR MANUFACTURING MAGNETOSTRICTIVE SHAFT APPLICABLE TO MAGNETOSTRICTION TYPE TORQUE SENSOR AND MAGNETOSTRICTIVE SHAFT MANUFACTURED BY THE METHOD THEREOF

[75] Inventors: Satoshi Kaise; Nobuaki Kobayashi; Hideki Kano, all of Atsugi, Japan

[73] Assignee: Unisia Jecs Corporation, Atsugi, Japan

[21] Appl. No.: 451,841

[22] Filed: May 30, 1995

[30] Foreign Application Priority Data

May 30, 1994 [JP] Japan .................................. 6-139527

[51] Int. Cl.$^6$ .................................................. G01L 3/00
[52] U.S. Cl. .................. 73/862.336; 427/374.6; 427/398.4
[58] Field of Search .............................. 427/374.4, 374.5, 427/374.6, 398.3, 398.4; 73/862.333, 862.334, 862.335, 862.336

[56] References Cited

U.S. PATENT DOCUMENTS

| | | | |
|---|---|---|---|
| 2,570,906 | 10/1951 | Alferieff | 427/398.4 |
| 3,261,712 | 7/1966 | Carter | 427/398.3 |
| 4,785,671 | 11/1988 | Wakamiya et al. | 73/862.336 |
| 4,840,073 | 6/1989 | Aoki et al. | 73/862.334 |
| 5,107,711 | 4/1992 | Aoki et al. | 73/862 |
| 5,419,206 | 5/1995 | Kamioka et al. | 73/862.333 |
| 5,419,207 | 5/1995 | Kobayashi et al. | 73/862.333 |

FOREIGN PATENT DOCUMENTS 1-247530  10/1989  Japan .

*Primary Examiner*—Richard Chilcot
*Assistant Examiner*—Ronald Biegel
*Attorney, Agent, or Firm*—Foley & Lardner

[57] ABSTRACT

In a method for manufacturing a magnetostrictive shaft applicable to a magnetostrictive torque sensor and a product of the magnetostrictive shaft manufactured by the above-described method, a magnetostrictive shaft manufactured by the above-described method, a magnetostrictive shaft is made of an Fe—Al alloy having an aluminum content ranging from 13 wt % to 16 wt %. A shaft material constituted by the magnetostrictive shaft is mechanically worked and heated for a predetermined time duration up to a predetermined temperature and being oil quenched under an Argon gas temperature.

18 Claims, 9 Drawing Sheets

5,562,004

METHOD FOR MANUFACTURING MAGNETOSTRICTIVE SHAFT APPLICABLE TO MAGNETOSTRICTION TYPE TORQUE SENSOR AND MAGNETOSTRICTIVE SHAFT MANUFACTURED BY THE METHOD THEREOF

BACKGROUND OF THE INVENTION

The present invention relates to a method for manufacturing a magnetostrictive shaft, the manufactured magnetostrictive shaft applicable to a magnetostrictive type torque sensor suited for detecting a torque applied to a rotational axis such as an output shaft of an automotive vehicle engine.

In an automotive vehicle on which an automatic power transmission is mounted, a magnetostrictive shaft is attached onto an output shaft of an engine associated with the power transmission to appropriate a gear shift timing of, for example, the automatic power transmission.

FIGS. 1 through 6 show a magnetostrictive torque sensor manufactured by a previously proposed method.

A casing 1 is formed with a stepped cylindrical shape and formed of a non-magnetic material. The casing 1 is fixed onto a casing of the automatic power transmission (not shown).

A magnetostrictive shaft 2 is disposed rotatably on a pair of bearings 3 and 3 fitted within the casing 1.

The magnetostrictive shaft 2 has both ends projected axially from the casing 1 so as to constitute a part of the output shaft, e.g., of the engine.

A shaft parent material 2A of the magnetostrictive shaft 2 is formed in a rod shape and of a structural steel such as Carbon Steel (CS), Nickel-Chromium Steel (SNCM), Nickel-Chromium-Molybdenum Steel Chromium Steel (SCr), Chrome-Molybdenum Steel (SCM), Manganese Steel (SMn), or Manganese-Chromium Steel (SMn C). In addition, a magnetic thin film 2B of the magnetostrictive shaft 2 is provided with a slit forming portion 2C located at a middle portion in the axial direction of the shaft 2. A plurality of slit grooves 4, 4,—are inscribed in line with each other on the part of the outer periphery of the magnetostrictive shaft 2 having obliquely inclined angles of 45 degrees. A plurality of other slit grooves 5, 5,—are inscribed in line with each other on the part of the outer periphery of the magnetostrictive shaft 2 having obliquely inclined angles of 45 degrees.

Each slit groove 4 and each slit groove 5 are spaced apart from each other in the axial direction having a predetermined interval, these slits 4 and 5 being formed at equal intervals over the outer peripheral surface of the slit forming portion 2C. A first magnetic anisotropy portion 6 of the magnetostrictive shaft 2 is formed between each of the slit grooves 4 and a second magnetic anisotropy portion 7 is formed between each of the slit grooves 5. These magnetic anisotropy portions 6 and 7 are formed with magnetic paths caused by a surface magnetic field generated by exciting first and second coils 9 and 10, respectively. The excitation and detection coils 9 and 10 will be described below.

A core member 8 is fixed on an inner peripheral surface of the casing 1 and serves to enclose the slit forming portion 2C of tile magnetostrictive shaft 2 from an outside of the radial direction of the slit forming portion 2C with a space. Each core member 8 is formed in the stepped cylindrical shape by means of the magnetic material such as iron. The excitation and detection coils 9 and 10 are disposed in tile inner side of the core member 8.

The first coil 9 and second coil 10 serve as exciting and detection coils opposed in the radial direction of the shaft 2 against the magnetic anisotropy portions 6 and 7 of the magnetostrictive shaft 2 and disposed in an inner peripheral side of the core member 8 via coil bobbins (not shown). An oscillator 13 to be described later carries out the application of an alternating voltage V to both of the first and second coils 9 and 10 so as enable actions of electromagnetic excitation and magnetic filed change detection, respectively. As shown in FIG. 2, the excitation and detection coils 9 and 10 have self inductances L1 and L2 and iron losses and DC components equivalent to r1 and r2, respectively.

As shown in FIG. 2, a detection circuit 11, namely, an equivalent circuit 11 of the magnetostrictive torque sensor is exemplified. In addition, an oscillator 13 as an AC voltage application source, a differential amplifier 14, and synchronization modulation processing circuit 15 are connected to the detection circuit 11.

The detection circuit 11 includes a bridge circuit 12 having first and second arms of both of the first and second coils 9 and 10 and having third and fourth arms of adjustable resistors R and R. It is noted that a junction a between the first coil 9 and the second coil 10 and another junction b between both of the adjustable resistors R and R are connected across the oscillator 13. The oscillator 13 oscillates and outputs the AC voltage Vf having a frequency of, for example, approximately 30 KHz.

In addition, another junction c in the bridge circuit 12 between the first coil 9 and the one adjustable resistor R is connected to a plus input end of the differential amplifier 14 and another junction d therein between the second coil 10 and the other adjustable resistor R is connected to a minus input end of the differential amplifier 14. Thus, a detection voltage V1 at the junction c and a detection voltage at the junction d are input to corresponding input ends of the differential amplifier 14. An output end 14A of the lo differential amplifier 14 is connected to an input end of the synchronization modulation processing circuit 15. Another input end of the circuit 15 receives the oscillation voltage Vf from the oscillator 13. The synchronization modulation processing circuit 15 synchronizes and rectifies an output voltage E0 from the differential amplifier 14 with the alternating current voltage Vf from the oscillator 13 so as to provide a DC output voltage E (corresponds to a torque detection sensitivity in FIG. 6).

FIGS. 4 and 5 show the previously proposed manufacturing method of the magnetostrictive shaft 2.

First, at a process I, a shaft parent material 2A constituted by the structural steel described above is heated up to a temperature ranging, for example, from about 750° C. about 900° C. to undergo a hardening so as to give the shaft parent material 2A a desired strength.

Next, at a process II, a magnetostrictive material made of such as an iron-aluminium (Fe—Al) alloy is spray coated over a whole periphery of the outer so peripheral surface of the shaft parent material 2A so that the magnetic thin film 2B is integrally formed with the shaft parent material 2A to constitute a shaft material 16.

At a process III, a surface working is carried out for the magnetic thin film 2B covering wholly the outer periphery of the shaft parent material 2A and a mechanical working for each slit groove 4 and 5 is carried out so as to form the magnetic anisotropy portions 6 and 7 on the surface of the magnetic thin film 2B.

At a heating process of process IV, the whole shaft material 16 on which the respective slit grooves 4 and 5 are inscribed is heated under the air or under a nitrogen gas up to, for example, 800° C. to 900° C., preferably about 850° C. This temperature is held for one hour or more.

Next, at a quenching process of process V, the whole shaft material 16 heated at the heating process of process IV is immersed into an oil 17 shown in FIG. 4 so as to perform the oil quenching. In this way, at the heating process IV and quenching process V, a magnetic annealing (heat treatment) is carried out so that a working distortion is eliminated from the shaft material 16 and a hysterisis loop magnitude is made small. Such a processing that deviations of torque detection sensitivity for each of the individual shaft materials 16 and of their hysterisis characteristics are made small is passed to complete the magnetostrictive shaft 2.

A detection operation of the magnetostrictive type torque sensor whose magnetostrictive shaft is manufactured by the previously proposed method described above will be described below.

First, when the AC alternating voltage Vf from the oscillator 13 is applied across the bridge circuit 12 as shown in FIG. 2, magnetic paths are formed along the magnetic anisotropy portions 6 and 7 provided between the respective slit grooves 4 and 5 in the slit forming portion 2C of the magnetostrictive shaft 2. In this case, the adjustable resistors R shown in FIG. 2 is adjusted to provide a zero output voltage E0 from the differential amplifier 14 with a torque applied to the magnetostrictive shaft 2 in zero state.

Then, when a torque is acted upon the magnetostrictive shaft 2 in a direction denoted by T of FIG. 2, a tensile strength $+\sigma$ is acted along the magnetic anisotropy portion 6 between the respective slit grooves 4 and a compressive stress $-\sigma$ along the magnetic anisotropy portion 7 provided between the respective slit grooves 5. Therefore, in a case where a positive magnetostrictive material is used in the is magnetostrictive shaft 2, a permeability $\mu$ of the magnetic anisotropy portion 6 is increased due to the tensile stress $+\sigma$ and the permeability $\nu$ is decreased due to the compressive stress $-\sigma$.

Thus, the self inductance L1 of the excitation and detection coil 9 opposed against the magnetic anisotropy portion 6 of the magnetostrictive shaft 2 is increased on the basis of the increase in the permeability $\nu$ so that a current flowing through the excitation and detection coil 9 is decreased. On the other hand, the self inductance L2 of the excitation and detection coil 10 opposed against the magnetostrictive shaft 7 is decreased so that a current i2 flowing through the excitation and detection coil 10 is increased.

Consequently, the detection voltage V1 from the excitation and detection coil 9 is decreased so that a detected voltage V2 to be input from the excitation and detection coil 10 to the minus end of the differential amplifier 14 is, in turn, increased. Therefore, since the differential amplifier 14 carries out a differential amplification action such as: $E0=A\times(V1-V2)$, wherein A denotes an amplification factor of the differential amplifier 14. Then, an AC output voltage EO derived from an output terminal of the differential amplifier 14 is output to the synchronization demodulation processing circuit 15. The synchronization demodulation processing circuit 15 carries out the synchronization demodulation processing for the output voltage E0 in accordance with the AC voltage Vf from the oscillator 13 and rectifies the output voltage E0. As shown in FIG. 6, a torque detection sensitivity (V) is output as a detection signal (as a DC output voltage E) corresponding to the torque (kgf.m) acted upon the magnetostrictive shaft 2.

It is noted that a relationship between the torque (kgf.m) applied to the magnetostrictive shaft 2 and the torque detection sensitivity (V) is expressed in a form of a characteristic line 18 shown in FIG. 6. As a ratio of a maximum output difference $\Delta Vh$ to an output full-scale VFS, the hysterisis when the torque is detected is derived as follows: Hysterisis=100×$\Delta Vh$/VFS (%).

A linearity of the torque detection signal is derived as follows, according to a maximum output deviation $\Delta Vr$ with respect to an ideal straight line 19 shown in FIG. 6:

Linearity=100×$\Delta Vr$/VFS (%).

In the previously proposed manufacturing method of the magnetostrictive shaft 2, since the shaft material 16 is heated and oil quenched under the air or nitrogen gas under the heat treatment of the heating process and quenching process, the magnetic thin film 2B is easy to be oxidized or nitrided on the surface of the shaft material 16. This causes the hysterisis to be increased. The linearity becomes worsened, In addition, the torque detection sensitivity (V) is reduced.

On the other hand, if the heating process and oil quenching process are carried out under a vacuum, the surface of the shaft material 16 can be prevented from being oxidized or nitrided. However, in this case, since a cooling velocity of the magnetic thin film 2B becomes slow, the torque detection sensitivity cannot always be improved.

That is to say, as appreciated from Table 1 as will be described later, for example, in a case where an Fe—Al alloy (iron-aluminium alloy) including Aluminum of 15 wt % (weight %), the surface of the magnetic thin film 2B is oxidized under the heating process and the quenching process so that the torque detection sensitivity is reduced up to 0.891 V (volts) with respect to a positive maximum torque and up to $-0.921$ V with respect to a minus maximum torque.

A Japanese Patent Application First Publication No. Heisei 1-247530 exemplifies a previously proposed heat treatment method of a measured shaft used for the torque sensor. In this Japanese Patent Application First Publication, at least one part of the shaft which constitute the shaft material to be measured comprises Fe—Al alloy (iron-aluminium alloy) having the content of Aluminum ranging from 11 to 14 wt% (weight %). Then, when the part of the shaft is heated and quenched under the vacuum atmosphere, an alloyed state of Fe—Al falls in an $\alpha$ phase (irregular phase), ($\alpha$+B2) phase or ($\alpha$+D03) phase, as shown in FIG. 13. It is noted that FIG. 13 will be explained later.

However, when the torque is applied to the shaft manufactured in the above-described method and the shaft is treated so as to increase the torque detection sensitivity, the hysterisis is, in turn, enlarged and the linearity is worsened. On the contrary, when the shaft is treated so as to improve the linearity with the hysterisis reduced, the torque detection sensitivity itself is, in turn, reduced.

SUMMARY OF THE INVENTION

It is therefore a principal object of the present invention to provide a manufacturing method of a magnetostrictive shaft applicable to a magnetostriction type torque sensor and a product of the magnetostrictive shaft manufactured by the method therefor by which an output hysterisis width when the torque is detected can be reduced toward an ideal straight line, a linearity can be improved, and the torque detection sensitivity can be enhanced.

The above-described object can be achieved by providing a method for manufacturing a magnetostrictive shaft applicable to a magnetostriction type torque sensor, said magnetostrictive shaft being integrated with a rotatable shaft and having at least a surface of which is made of a magnetostrictive material, comprising the steps of: a) mechanically working a shaft material at least the surface of which is made of the magnetostrictive material; b) heating the mechanically worked shaft material for a predetermined time duration up to a predetermined temperature under a predetermined pressurized rare gas atmosphere; and c) quenching heated shaft material so as to quickly cool the heated shaft material, said magnetostrictive material being constituted by an iron-aluminium alloy having an Aluminum content ranging from 13 to 16 wt %.

The above-described object can also be achieved by providing a magnetostrictive shaft comprising a shaft material, said shaft material having at least surface of which is made of a magnetostrictive material, wherein said magnetostrictive material is constituted by an iron-aluminium alloy having an Aluminum content ranging from 13 wt % to 16 wt %, said shaft material being mechanically worked to form a plurality of slit grooves so as to provide a pair of magnetic anisotropy portions on the surface of the shaft material, said mechanically worked shaft material being heated for a predetermined time duration ranging from 0.5 hours to three hours up to a predetermined temperature ranging from 400° C. to 900° C. under a pressurized Argon gas atmosphere and being, thereafter, immersed into an oil under the pressurized Argon gas atmosphere so as to perform an oil quenching.

BEST MODE CARRYING OUT THE INVENTION

Reference will hereinafter be made to the drawings in order to facilitate a better understanding of the present invention.

FIGS. 7 through 13 show a magnetostrictive shaft of a magnetostriction type torque sensor to which a manufacturing method in a preferred embodiment according to the present invention is applicable and which is manufactured in the method in the embodiment.

Figure 1:
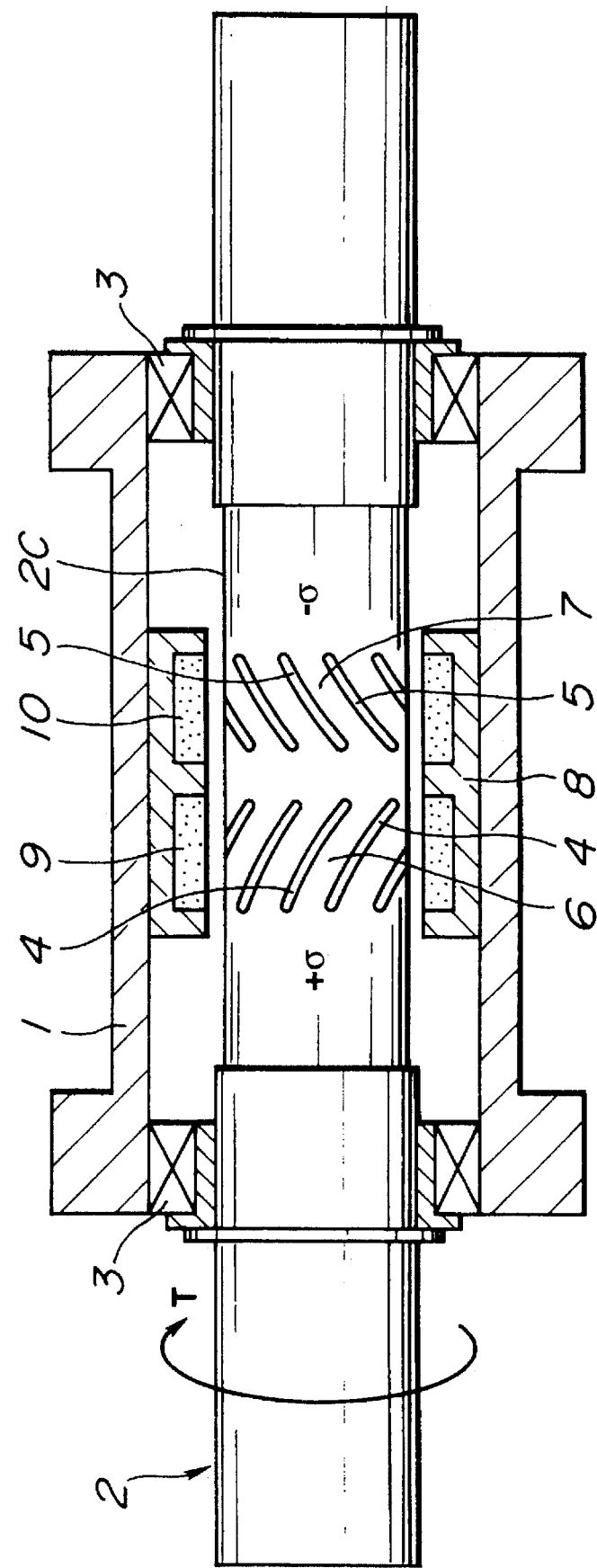
FIG. 1 is a longitudinal cross sectional view of a magnetostriction type torque sensor to which the present invention is applicable.
Figure 7:
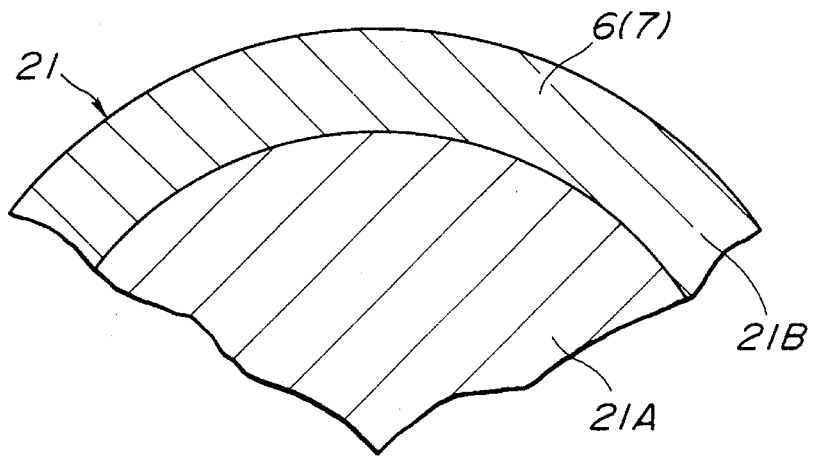
FIG. 7 is a lateral cross sectional view of an essential part of the magnetostrictive shaft manufactured in a manufacturing method in a preferred embodiment according to the present invention.

In FIG. 7, the magnetostrictive shaft 21 is generally constituted by the shaft parent material 21A and magnetic thin film 21B in the same way as the magnetostrictive shaft 2 described in the BACKGROUND OF THE INVENTION. The magnetic thin film 21B is formed by the magnetic anisotropy portions 6 and 7 described in the BACKGROUND OF THE INVENTION. (Therefore, the explanation of the magnetic anisotropy portions 6 and 7 shown in FIG. 1 in the BACKGROUND OF THE INVENTION is herein incorporated by reference.)

However, it is noted that the magnetic thin film 21B of the magnetostrictive shaft 21 in the case of the preferred embodiment is formed of a magnetostrictive material constituted by an Fe—Al (iron-aluminium alloy) alloy whose content of the Aluminum ranges from 13 through 16 wt % (weight %), preferably, 14 through 16 wt %.

Figure 13:
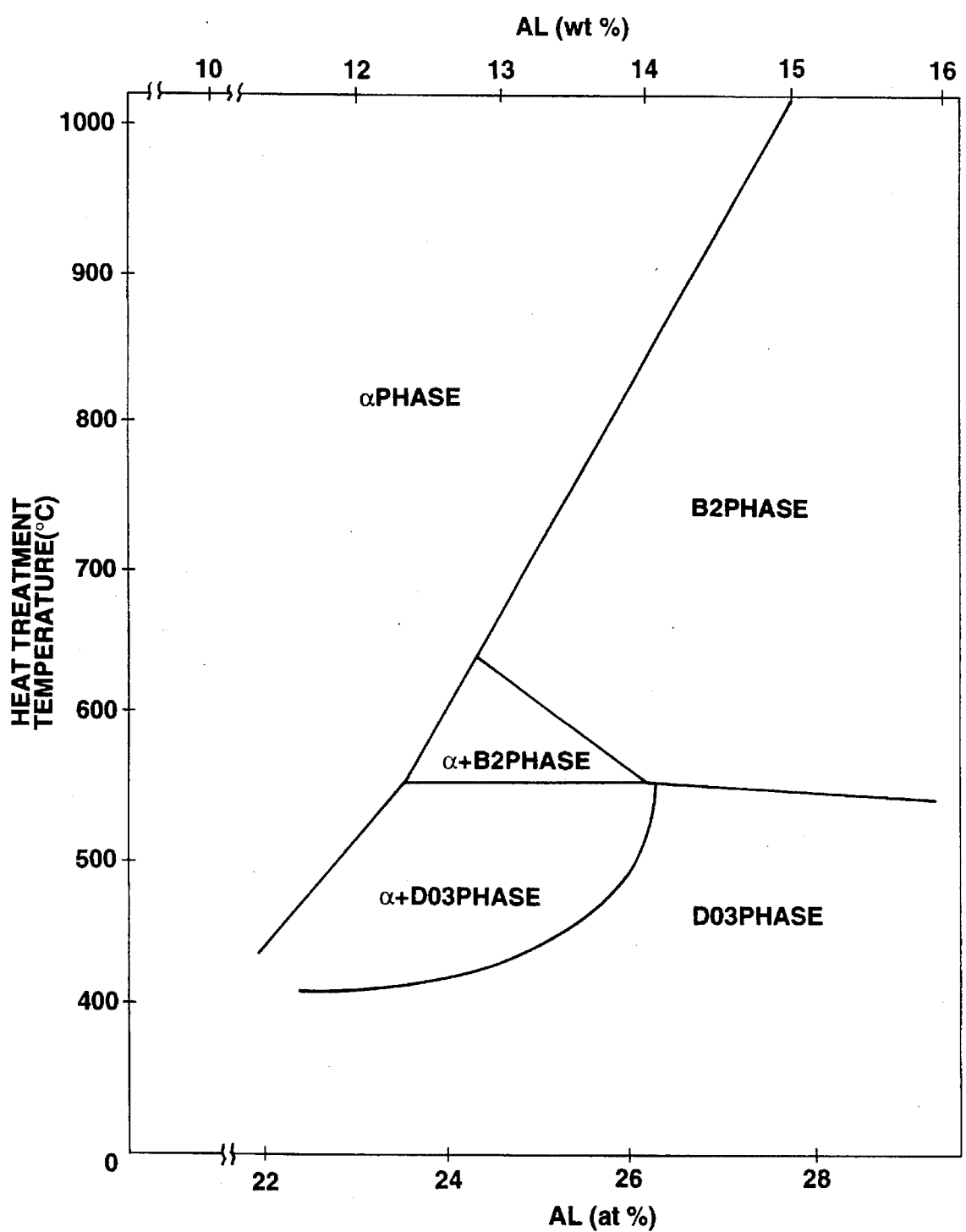
FIG. 13 is an alloyed status transition diagram of an Fe—Al (iron-aluminium) alloy with respect to the heat treatment temperature.

Then, it is noted that the Fe—Al alloy used as the magnetostrictive material of the magnetic thin film 21B is selected such that the Fe—Al alloyed state becomes B2 phase (Fe Al type regular (order) phase) or D03 phase (Fe$_3$Al type regular (order) phase) by the adjustment of the heat treatment temperature, as shown in FIG. 13.

FIG. 13 shows the Fe—Al alloyed state transition diagram as a relationship between an atomic weight ratio (at %) or weight ratio (wt %) of Aluminum (Al) with respect to iron (Fe) and a heat treatment temperature (°C.).

Next, the manufacturing processes of the magnetostrictive shaft 21 in the embodiment will be explained with reference to FIGS. 8 and 9.

Figure 8:
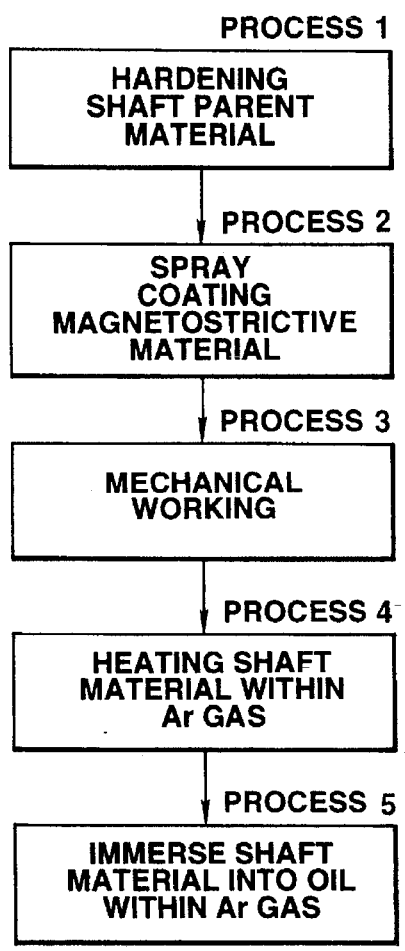
FIG. 8 is an explanatory view for explaining processes of manufacturing the magnetostrictive shaft in the preferred embodiment according to the present invention.

The manufacturing processes of the magnetostrictive shaft 21 in the case of the embodiment include processes 1 through 5 as described in FIG. 8.

Figure 5:
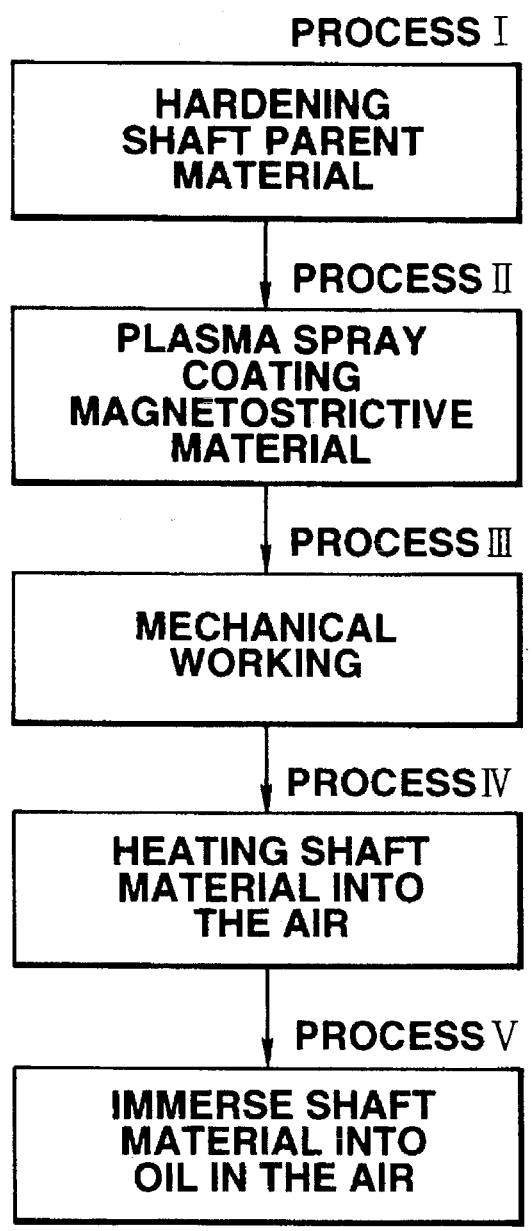
FIG. 5 is an explanatory view for explaining processes of manufacturing the magnetostrictive shaft in the case of the first previously proposed manufacturing method described in the BACKGROUND OF THE INVENTION.
Figure 6:
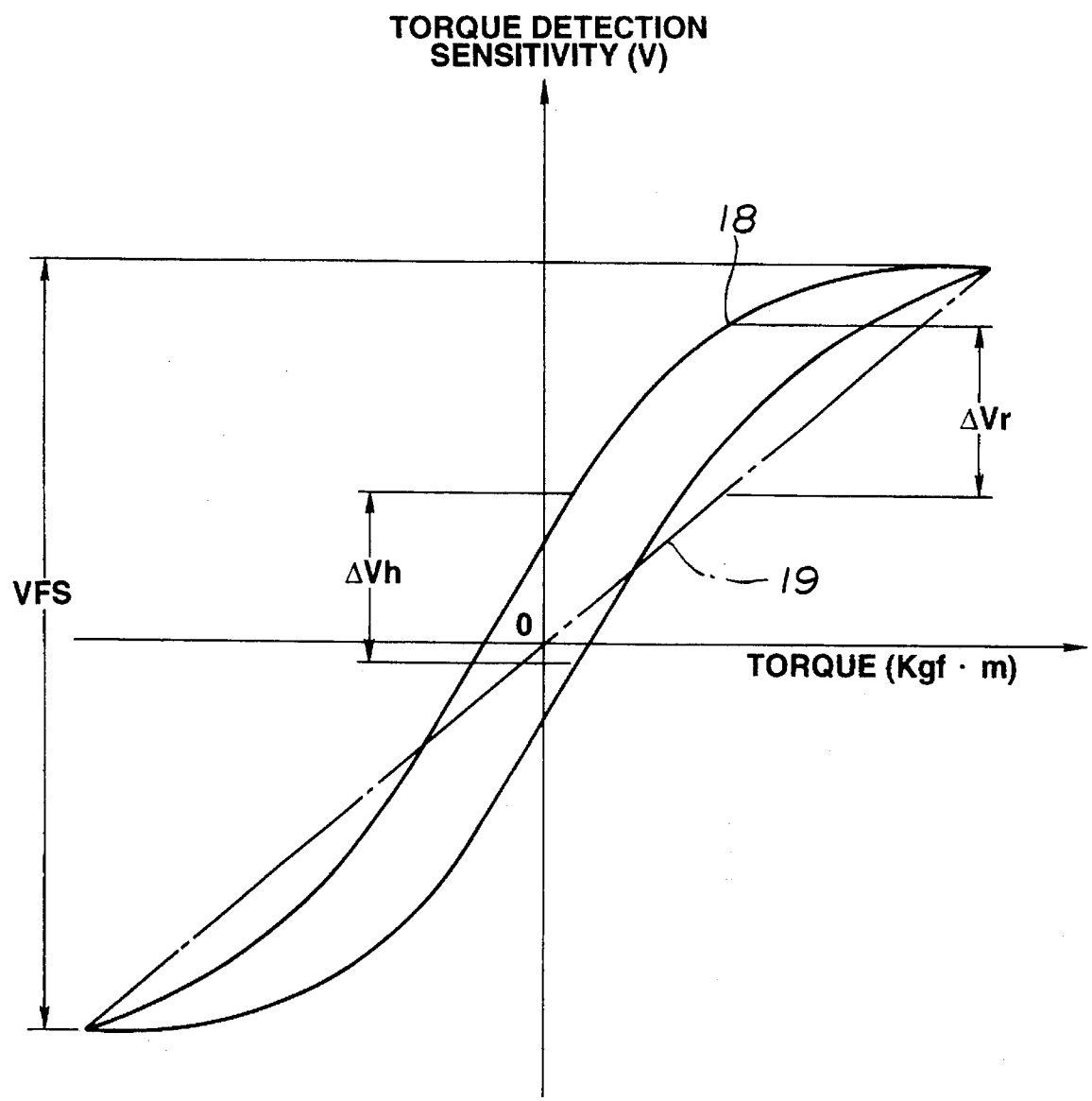
FIG. 6 is a characteristic graph representing a relationship between a torque (Kgf.m) applied to the magnetostrictive shaft and the torque detection sensitivity (V).

Processes 1 through 3 shown in FIG. 8 indicate working process. The working process is generally the same as processes I through III shown in FIG. 5 and described in the BACKGROUND OF THE INVENTION. At the process 1, the shaft parent material 21A constituted by the structural steel selected from a group described in the BACKGROUND OF THE INVENTION is heated up to a temperature ranging from, about 750° C. through 900° C. to perform the hardening of the shaft parent material 21A.

Figure 9:
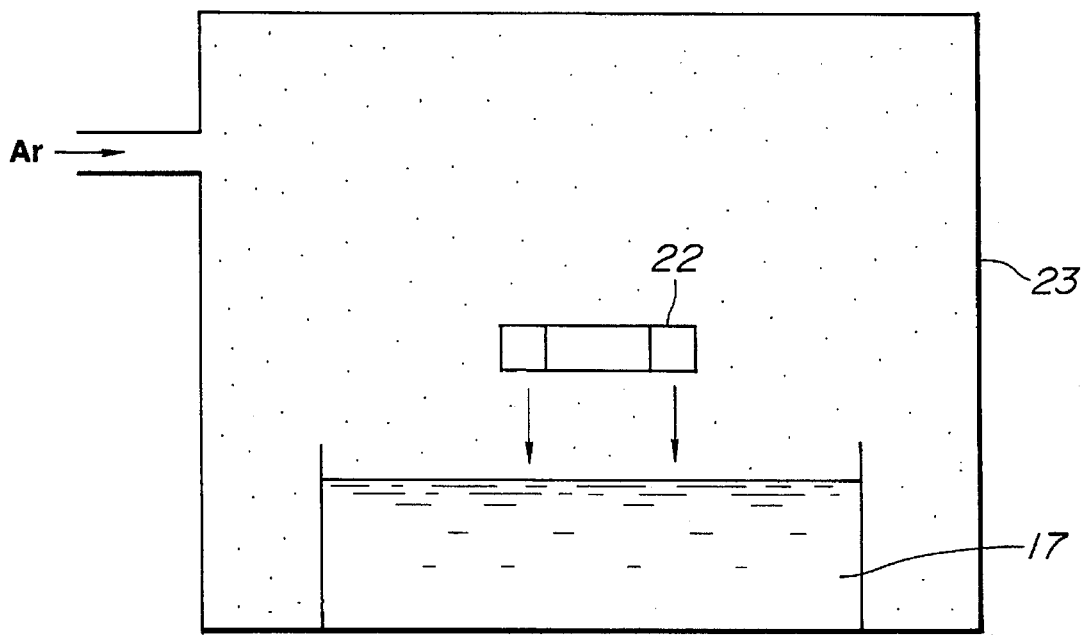
FIG. 9 is an explanatory view for explaining an oil quenching process in which the shaft material is oil quenched within an air-tightly sealed chamber.

At the process 2, the magnetostrictive material constituted by the Fe—Al alloy having the content (weight ratio) of Aluminum ranging from 13 through 16 wt % (weight %), preferably from 14 through 16 wt % is spray coated over a whole peripheral surface of the shaft parent material 21A so that the magnetic thin film 21B is integrated onto the shaft parent material 21A, thus forming a shaft material 22 shown in FIG. 9.

Then, at a process 3, the surface treatment on the magnetic thin film 21B covering the whole outer periphery of the shaft parent material 21A is carried out and a mechanical working for the respective slit grooves 4 and 5 (refer to FIG. 1) is carried out so as to form the magnetic anisotropy portions 6 and 7 on the surface of the magnetic thin film 21B. (Therefore, the explanation of FIG. 1 in the BACKGROUND OF THE INVENTION is herein incorporated by reference.)

Next, at a heating process of the process 3, with an Argon gas (rare gas) having a pressure ranging from, for example, 0.067 MPa to 0.080 MPa (500 through 600 Torr) supplied within an air-tightly sealed chamber 23 shown in FIG. 9, the shaft material 22 is heated up to a temperature, for example, ranging from 400° C. to 900° C., preferably, about 500° C. (in the case of DO3 phase shown in FIG. 13) or about 850° C. (in the case of 62 phase shown in FIG. 13) by means of such a heating means as an electrical furnace (not shown). At this time, this set temperature state is held for a time duration of about 0.5 hours to 3 hours, preferably, of about two hours.

Next, at an oil quenching process of process 5, the whole shaft material 22 heated at the previous heating process is, for example, immersed into oil 17 within the same air-tightly sealed chamber 23 in which the Argon gas is filled, as shown in FIG. 9, so as to undergo an oil quenching for the shaft material 22. Consequently, a magnetic annealing is carried out according to a heat treatment comprising the above-described heating process and the oil quenching process.

In this case, the magnetic thin film 216 which is located on the surface of the shaft material 22 is constituted by the Fe—Al alloy having the content of Aluminum A1 ranging from 13 wt % to 16 wt %. When a heat treatment temperature at the above-described magnetic annealing is higher than, for example, about 550° C., as shown in FIG. 13, the alloyed state of Fe—Al alloy gives the regular phase of Fe—Al type (62 phase). When the heat temperature thereat is lower than about 550° C., the alloyed state of Fe—Al alloy gives D03 phase (regular phase of Fe₃Al type).

In the preferred embodiment, the magnetic thin film 216 formed integrally over the whole peripheral surface of the magnetostrictive shaft 21 is constituted by the magnetostrictive material made of the Fe—Al alloy having the content of Aluminum (A1) ranging from 13 to 16 wt %. At the heating process, the shaft material 22 is heated under the pressurized Argon gas atmosphere up to the temperature, for example, ranging from 400° through 900° C., preferably about 500° C. (in the case of DOS phase) or about 880° C. (in the case of B2 phase) for about two hours. At the oil quenching process, the whole shaft material 22 heated at the heating process is immersed into the oil 17 under the Argon gas atmosphere so as to perform the oil quenching, thus the magnetic annealing being carried out. Hence, the following advantages can be exhibited.

That is to say, since the pressurized Argon gas is is filled around the shaft material 22 at the heating process, the magnetic thin film 21b on the surface of the shaft material 22 can effectively be prevented from being oxidized or nitrided when the shaft material 22 is heated to such a high temperature state as described above (for example, 400° to 900° C.). Especially, when the heat treatment temperature is made higher than about 550° C. and the alloyed state of the Fe—Al alloy gives B2 phase (Fe Al type regular phase) (shown in FIG. 13), a maximum hysterisis width can be reduced and the linearity can be improved. The definitions of terms of the hysterisis and linearity have been described in the BACKGROUND OF THE INVENTION. (Therefore, the explanation of FIG. 2 in the BACKGROUND OF THE INVENTION is herein incorporated by reference.)

In addition, since the shaft material 22 is immersed into the oil 17 under the Argon gas atmosphere, a cooling speed of the shaft material 22 can effectively be fastened. Consequently, a large torque detection sensitivity can be provided for the magnetostrictive shaft 21 in the embodiment. Especially, when the heat treatment temperature is made lower than about 550° C. so that the alloyed state of the Fe—Al alloy gives DOS phase (Fe₃Al type regular phase), the enlarged torque detection sensitivity can be assured.

As shown in Table 1, three shaft materials were heated for about two hours up to a temperature of about 850° C. and, thereafter, oil quenched under the vacuum atmosphere and under the Argon gas atmosphere separately, thereby deriving the torque detection sensitivities, hysterisis, and linearities for the three shaft materials as experimental data. It is noted that the experimental data were derived using the detection circuit 11 shown in FIG. 2.

The three shaft materials were a first shaft material having the magnetic thin film 21B consisting of the Fe—Al alloy of the Aluminum content of 10 wt % ( in Table 1, 10 wt % shaft material), a second shaft material having the magnetic thin film 21B comprising the Fe—Al alloy of the Aluminum content of 13 wt % (in Table 1, 13 wt % shaft material), and a third shaft material having the magnetic thin film 21B comprising the Aluminum content of 15 wt % (in Table 1, 15 wt % shaft material).

Consequently, as shown in Table 1, it was confirmed that the torque detection sensitivity could remarkably be improved in the case where the heat treatments were carried out under the Argon gas atmosphere as compared with the heat treatments for the shaft materials carried out under the vacuum atmosphere, except the first shaft material of 10 wt % under the vacuum atmosphere and under the Argon gas atmosphere.

In addition, it was confirmed that in the case where the heat treatments were carried out under the Argon gas atmosphere, the completed magnetostrictive shaft materials could reduce the hysterisis characteristics and could improve the linearities as compared with the heat treatments for the shaft materials under the vacuum atmosphere, except the 13 wt % shaft material under the vacuum atmosphere and under the Argon gas atmosphere.

In this case, since the second shaft material of Al content of 13 wt % was heat treated at the temperature about 850° C., the alloyed state of the Fe—Al alloy gave the α phase as shown in FIG. 13.

Figure 10:
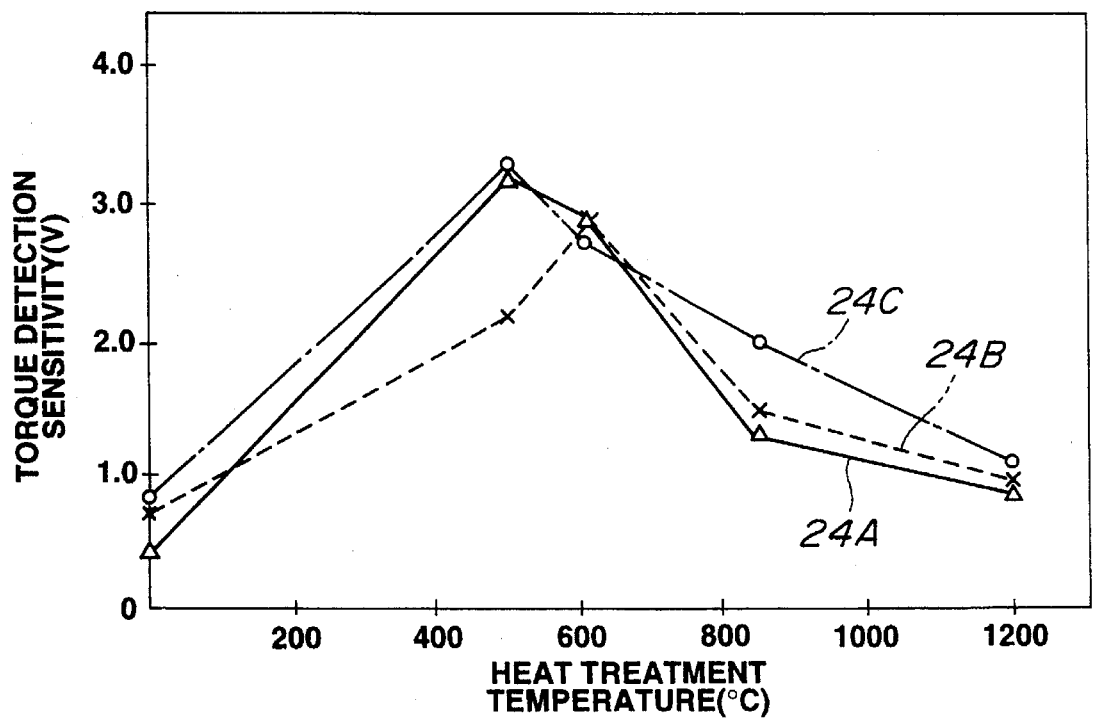
FIG. 10 is a characteristic-lines diagram representing a relationship between a heat treatment temperature and a torque detection sensitivity.
Figure 11:
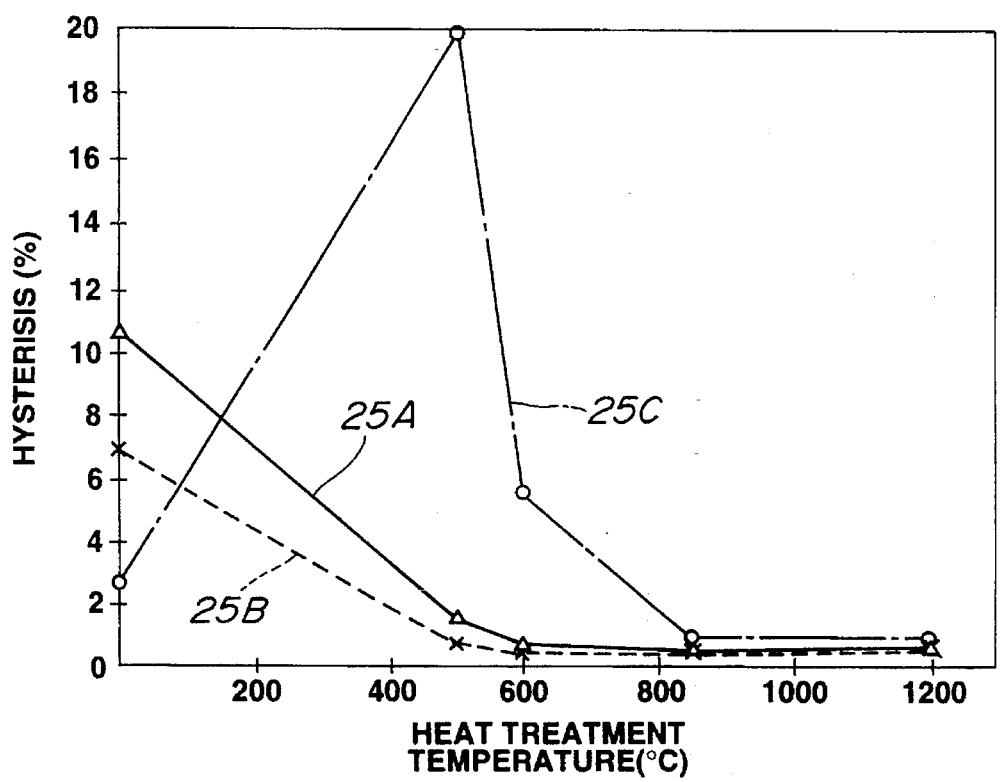
FIG. 11 is a characteristic-lines diagram representing a relationship between a heat treatment temperature and a hysterisis.
Figure 12:
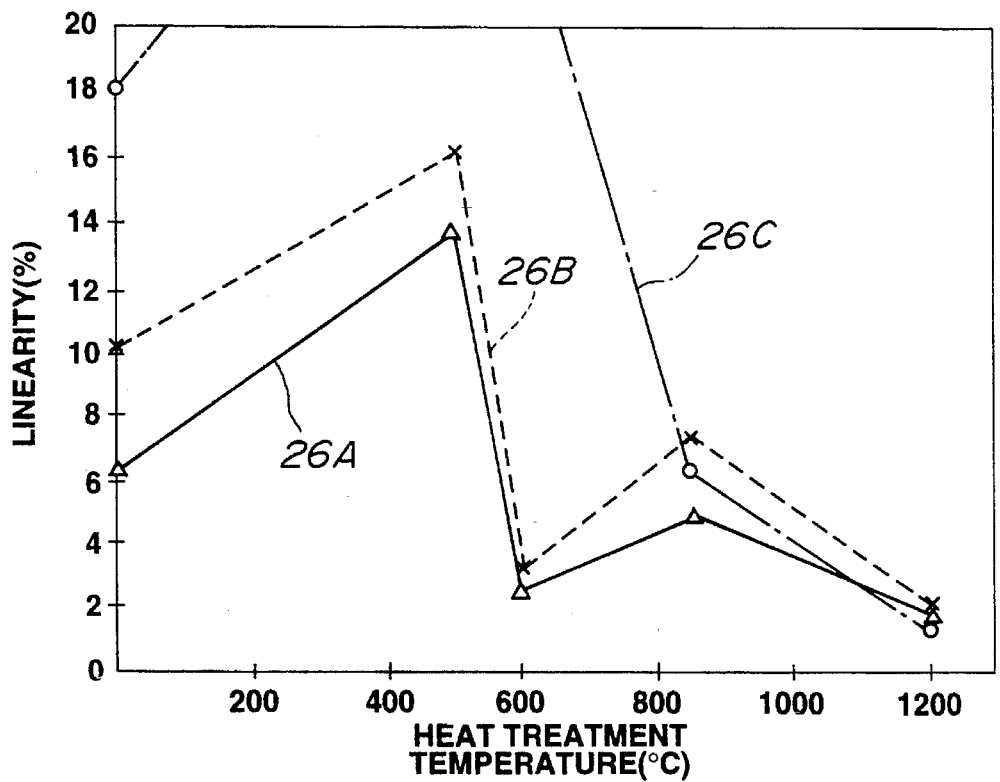
FIG. 12 is a characteristic-lines diagram representing a relationship between the heat treatment temperature and the linearity of Fe—Al alloy.

On the other hand, when the first shaft material of 10 wt %, the second shaft material of 13 wt %, and the third shaft material of 15 wt % were heat treated for about two hours under the Argon gas atmosphere, their heat treatment temperatures were appropriately varied so that the torque detection sensitivities (V), hysterisis characteristics (%) and linearities (%) in these cases of the heat treated shaft materials were derived as the experimental data shown in Table 2, as characteristic lines of 24A, 24B, and 24C shown in FIG. 10, as characteristic lines 25A, 25B, and 25C shown in FIG. 11, and characteristic lines 26A, 26B, and 26C shown in FIG. 12, respectively.

The characteristic lines 24A, 25A, and 26A denoted by solid lines shown in FIGS. 10 through 12 are the case wherein the third shaft material having the Aluminum content of 15 wt % was used and was constituted by the Fe—Al alloy to be the subject in the embodiment (particularly, the content of Al ranging from 14 to 16 wt %).

In addition, the characteristic lines 24B, 25B, and 26B denoted by dotted lines in FIGS. 10 through 12 were first comparative examples in which the second shaft material having the Aluminum content of 13 wt % was used and the characteristic lines 24C, 25C, and 26C denoted by dot-and-dash lines were second comparative examples in which the first shaft material having the Aluminum content of 10 wt % was used.

As appreciated from Table 2, it was confirmed that in the case where the third shaft material having the Aluminum content of 15 wt % (refer to the characteristic lines 24A, 25A, and 26A shown in FIGS. 10 through 12) was heat treated up to a temperature ranging, for example, from about 550° C. to about 900° C. so that the alloyed state of Fe—Al alloy gives the B2 phase (Fe Al type regular phase), the torque detection sensitivity could be improved, the hysterisis characteristic could be reduced, and the linearity could remarkably be improved.

In addition, it was confirmed that in the case where the third shaft material having the Aluminum content of 15 wt % (refer to the characteristic lines 24A, 25A, and 26A in FIGS. 10 through 12) was heat treated at a temperature range, for example, from 400° C. to 550° C. so that the alloyed state of Fe—Al alloy gave the DO3 phase (Fe$_3$Al type regular phase) shown in FIG. 13, the hysterisis characteristic could be reduced, the linearity characteristic could be improved, and the sufficiently large torque detection sensitivity could be achieved.

Hence, in the manufacturing method of the magnetostrictive shaft in the embodiment, the magnetic thin film 21B integrally formed on the whole periphery of the surface of the magnetostrictive shaft 21 is constituted by the magnetostrictive material consisting of the Fe—Al alloy having the Aluminum content ranging from 13 wt % to 16 wt %, the magnetic thin film 21B is heat treated under the pressurized Argon gas atmosphere and oil quenched from the temperature ranging from 400° C. to 900° C. at a high speed under the Argon gas atmosphere so that the alloyed state of Fe—Al alloy gives DOS phase or B2 phase shown in FIG. 13. Consequently, the hysterisis characteristic can be reduced, the linearity can be improved, and the higher torque detection sensitivity can be assured.

Although in the embodiment the magnetic thin film 21B consisting of the Fe—Al alloy having the Aluminum content ranging from 18 wt % to 16 wt % is spray coated on the surface of the shaft parent material 21A so as to form the shaft material 22 and the shaft material 22 is heat treated so that the magnetostrictive shaft 21 is manufactured, the whole shaft material 22 (magnetostrictive shaft 21) may be formed of the magnetostrictive material having the Fe—Al alloy having the Aluminum content ranging from 13 wt % to 16 wt %.

In addition, although, in the embodiment, the heat treatment (heating process and oil quenching process) of the shaft material 22 was carried out under the Argon gas atmosphere, another rare gas such as He (Helium) gas or Ne (Neon) gas may alternatively be used.

Figure 2:
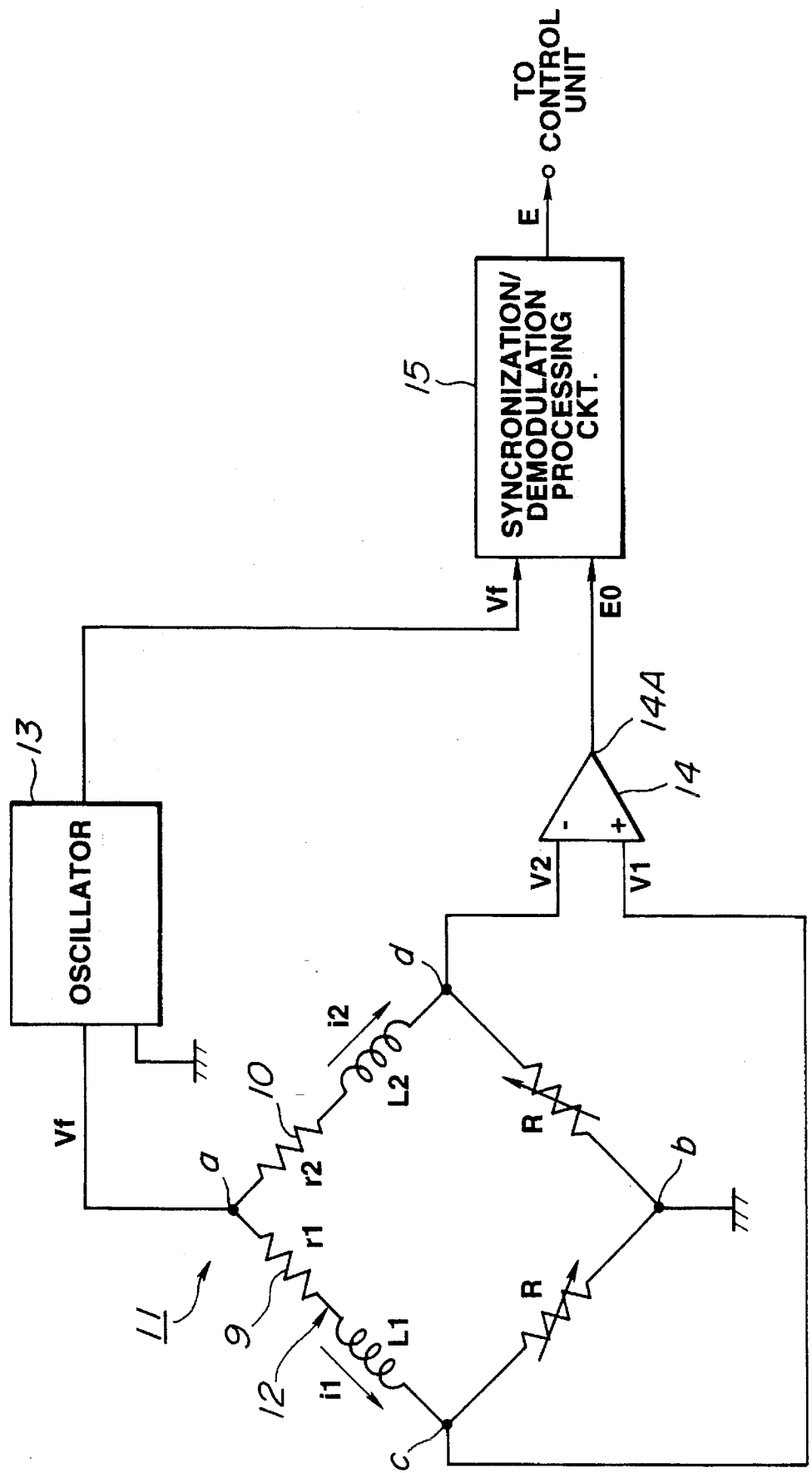
FIG. 2 is a circuit block diagram of a torque detection (transducing) circuit into which the magnetostriction torque sensor shown in FIG. 1 is electrically connected via coils.
Figure 3:
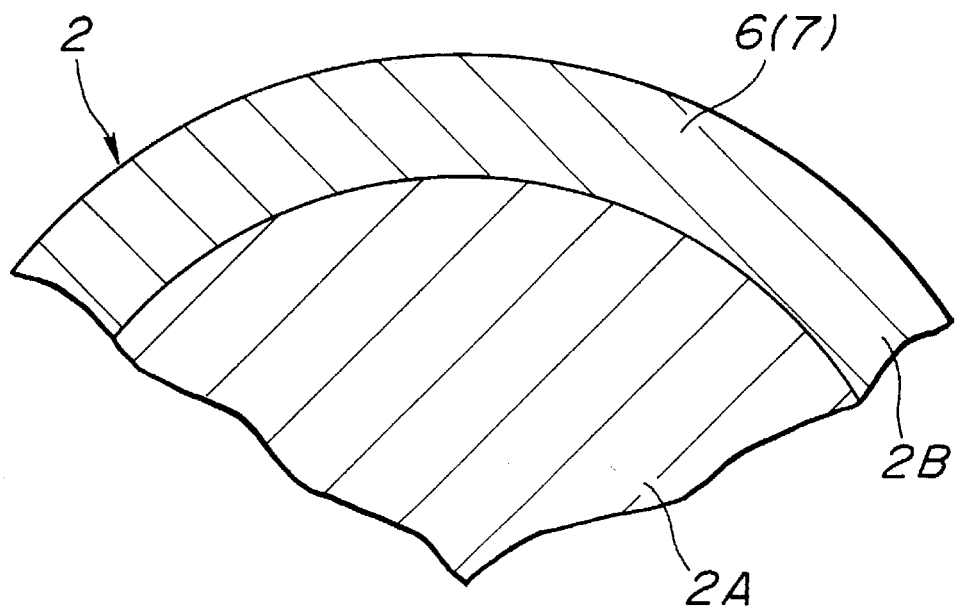
FIG. 3 is an enlarged lateral cross sectional view of an essential part of a magnetostrictive shaft shown in FIG. 1.
Figure 4:
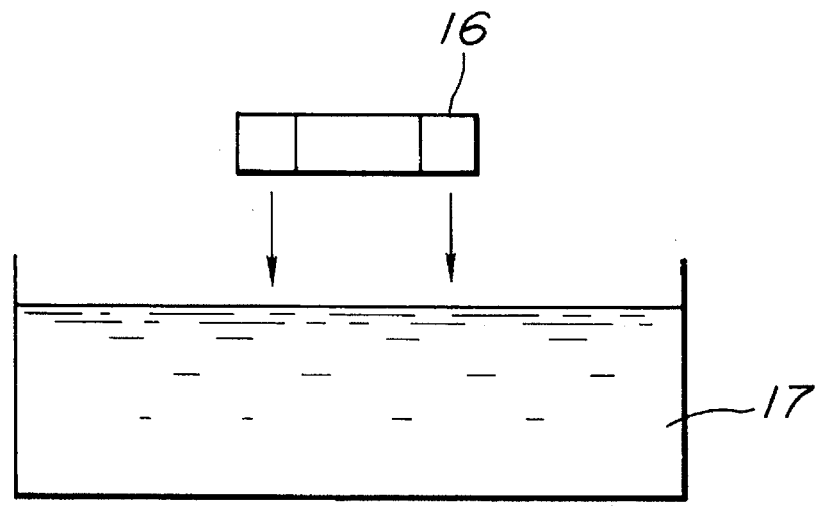
FIG. 4 is an explanatory view for explaining an oil quenching process of a shaft material in a first so previously proposed manufacturing method described in the BACKGROUND OF THE INVENTION

It is noted that when the experimental data shown in Tables 1 and 2 and FIGS. 10, 11, and 12 were derived by using the detection circuit 11 shown in FIG. 2. It is also noted that the synchronization demodulation processing circuit 15 shown in FIG. 2 generally includes: a) a non-inverting amplifier having a gain of +1 so as to pass a positive voltage waveform derived from the differential amplifier 14; b) an inverting amplifier having a gain of −1 so as to invert a negative voltage waveform below zero derived from the differential amplifier 14; c) an analog drive switch which passes the positive voltage waveform equal to or above zero level when the AC voltage waveform from the oscillator 13 is equal to zero and at the positive side and which passes the inverted positive voltage waveform from the inverting amplifier when the AC voltage waveform from the oscillator 18 is below the zero level and at the negative side; and d) a maximum value (peak) hold circuit (alternatively, averaging circuit) which is so constructed and arranged so as to provide the DC voltage value E corresponding to the magnitude and direction of the torque applied to the shaft 2 (21). The circuit 15 is made of an IC.

The structure of the torque sensor and torque detection circuit are also exemplified by the U.S. patent application Ser. No. 08/845,751 filed on Nov. 22, 1994, (the disclosure of which is herein incorporated by reference).

TABLE 1

| HEAT TREATMENT AT-MOSPHERE | Al CONTENT | TORQUE DETECTION SENSITIVITY (V) | | HYSTERISIS (%) | LINEARITY (%) |
| --- | --- | --- | --- | --- | --- |
| | | POSITIVE TORQUE | NEGATIVE TORQUE | | |
| OIL QUENCHING UNDER VACUUM | 10 wt % | 1.633 | −1.877 | 1.7 | 6.7 |
| | 13 wt % | 0.951 | −1.047 | 0.3 | 3.6 |
| | 15 wt % | 0.891 | −0.921 | 0.7 | 3.0 |
| OIL QUENCHING UNDER Ar GAS | 10 wt % | 1.963 | −1.783 | 0.8 | 6.1 |
| | 13 wt % | 1.441 | −1.238 | 0.5 | 7.2 |
| | 15 wt % | 1.340 | −1.310 | 0.5 | 4.8 |

TABLE 2

| HEAT TREATMENT TEMP. | Al CONTENT | TORQUE DETECTION SENSITIVITY (V) | | HYSTERISIS (%) | LINEARITY (%) |
| --- | --- | --- | --- | --- | --- |
| | | POSITIVE TORQUE | NEGATIVE TORQUE | | |
| 1200° C. | 10 wt % | 1.081 | −1.080 | 0.9 | 1.3 |
| | 13 wt % | 0.910 | −0.913 | 0.2 | 2.0 |
| | 15 wt % | 0.837 | −0.878 | 0.6 | 1.7 |
| 850° C. | 10 wt % | 1.963 | −1.783 | 0.8 | 6.1 |
| | 13 wt % | 1.441 | −1.238 | 0.5 | 7.2 |
| | 15 wt % | 1.340 | −1.310 | 0.5 | 4.8 |
| 600° C. | 10 wt % | 2.749 | −2.450 | 5.8 | 25.1 |
| | 13 wt % | 2.880 | −2.815 | 0.5 | 3.0 |
| | 15 wt % | 2.901 | −3.011 | 0.4 | 2.5 |
| 500° C. | 10 wt % | 3.183 | −1.953 | 20.4 | 31.3 |
| | 13 wt % | 2.164 | −2.015 | 0.7 | 16.1 |
| | 15 wt % | 3.166 | −3.299 | 1.6 | 13.9 |
| 0° C. | 10 wt % | 0.870 | −0.764 | 2.7 | 18.1 |
| | 13 wt % | 0.760 | −0.877 | 7.0 | 10.2 |
| | 15 wt % | 0.483 | −0.595 | 10.8 | 6.4 |

What is claimed is:

1. A method for manufacturing a magnetostrictive shaft applicable to a magnetostriction type torque sensor, said magnetostrictive shaft being integrated with a rotatable shaft and having a surface which is made of a magnetostrictive material, comprising the steps of:

a) mechanically working a shaft material at least the surface of which is made of the magnetostrictive material;

b) heating the mechanically worked shaft material for a predetermined time duration up to a predetermined temperature under a predetermined pressurized rare gas atmosphere; and c) quenching the heated shaft material so as to quickly cool the heated shaft material, said magnetostrictive material being constituted by an iron-aluminium alloy having an aluminum content ranging from 13 to 16 wt %.

2. A method for manufacturing a magnetostrictive shaft applicable to a magnetostriction type torque sensor, said magnetostrictive shaft being integrated with a rotatable shaft and having a surface which is made of a magnetostrictive material as claimed in claim 1, wherein said predetermined time duration ranges from 0.5 hours to three hours, said predetermined temperature ranges from 400° C. to 900° C., and said predetermined rare gas is Argon gas.

3. A method for manufacturing a magnetostrictive shaft applicable to a magnetostriction type torque sensor, said magnetostrictive shaft being integrated with a rotatable shaft and having a surface which is made of a magnetostrictive material as claimed in claim 2, said Argon gas is pressurized in an air-tightly sealed chamber up to a pressure ranging from 0.067 MPa to 0.080 MPa, said quenching process is carried out in the same chamber as in the heating process.

4. A method for manufacturing a magnetostrictive shaft applicable to a magnetostriction type torque sensor, said magnetostrictive shaft being integrated with a rotatable shaft and having a surface which is made of a magnetostrictive material as claimed in claim 1, wherein said predetermined time duration is about two hours.

5. A method for manufacturing a magnetostrictive shaft applicable to a magnetostriction type torque sensor, said magnetostrictive shaft being integrated with a rotatable shaft and having a surface which is made of a magnetostrictive material as claimed in claim 1, wherein the predetermined temperature is about 500° C. so that an alloyed state of the Fe—Al alloy constituting the magnetostrictive material gives B2 phase.

6. A method for manufacturing a magnetostrictive shaft applicable to a magnetostriction type torque sensor, said magnetostrictive shaft being integrated with a rotatable shaft and having a surface of which is made of a magnetostrictive material as claimed in claim 1, wherein the predetermined temperature is about 850° C. so that an alloyed state of the Fe—Al alloy constituting the magnetostrictive material gives D03 phase.

7. A magnetostrictive shaft comprising a shaft material, said shaft material having surface which is made of a magnetostrictive material, wherein said magnetostrictive material is constituted by an iron-aluminium alloy having an Aluminum content ranging from 13 wt % to 16 wt %, said shaft material being mechanically worked to form a plurality of slit grooves so as to provide a pair of magnetic anisotropy portions on the surface of the shaft material, said mechanically worked shaft material being heated for a predetermined time duration ranging from 0.5 hours to three hours up to a predetermined temperature ranging from 400° C. to 900° C. under a pressurized Argon gas atmosphere and being, thereafter, immersed into an oil under the pressurized Argon gas atmosphere so as to perform an oil quenching.

8. A magnetostrictive shaft comprising a shaft material, said shaft material having surface which is made of a magnetostrictive material as claimed in claim 7, wherein said magnetostrictive shaft is constituted by a shaft parent material made of a structural steel quench hardened up to a temperature approximately ranging from 750° C. to 900° C., said magnetostrictive material being spray coated over a whole outer periphery of the shaft parent material after the quench hardening of the shaft parent material so as to so constitute said shaft material.

9. A magnetostrictive shaft comprising a shaft material, said shaft material having surface which is made of a magnetostrictive material as claimed in claim 7, wherein said predetermined time duration is about two hours and said predetermined temperature is about 550° C. so that an alloyed state of the Fe—Al alloy gives a D08 phase.

10. A magnetostrictive shaft comprising a shaft material, said shaft material having surface which is made of a magnetostrictive material as claimed in claim 9, wherein said magnetostrictive shaft has the aluminum content of 15 wt % and said predetermined temperature ranges from about 400° C. to about 550° C.

11. A magnetostrictive shaft comprising a shaft material, said shaft material having surface which is made of a magnetostrictive material as claimed in claim 8, wherein said predetermined time duration is about two hours and said predetermined temperature is about 850° C. so that an alloyed state of the Fe—Al alloy gives a B2 phase.

12. A magnetostrictive shaft comprising a shaft material, said shaft material having surface which is made of a magnetostrictive material as claimed in claim 11, wherein said magnetostrictive material has the Aluminum content of 15 wt % and said predetermined temperature ranges from about 550° C. to 900° C.

13. A magnetostrictive shaft comprising a shaft material, said shaft material having surface which is made of a magnetostrictive material as claimed in claim 10, which further comprises: a) a pair of first and second excitation and detection coils, each coil wound so as to face against the corresponding one of the magnetic anisotropy portions of the magnetostrictive shaft with a predetermined space; an oscillator oscillating an AC voltage having a predetermined oscillation frequency and a predetermined amplitude; a bridge circuit having first, second, third, and fourth arms, said first arm having said first excitation and detection coil, said second arm having said second excitation and detection coil, said third and fourth arms having variable resistors, a first junction between the first and second arms being connected to an output end of said oscillator, a second and third junctions between the first and third arms being connected to first and second input ends of a differential amplifier, and an output end of said differential amplifier being connected to a first input end of a synchronization modulation processing circuit, a second input end of said synchronization modulation processing circuit being connected to the output end of said oscillator, an output voltage of said synchronization modulation processing circuit being previously set to zero according to the adjustment of either of said variable resistors when no torque is applied to said magnetostrictive shaft.

14. A magnetostrictive shaft comprising a shaft material, said shaft material having surface which is made of a magnetostrictive material as claimed in claim 13, wherein a torque detection sensitivity (V) is an output DC voltage level (E) of said synchronization modulation processing circuit, a hysterisis characteristic of the magnetostrictive type torque sensor is expressed as Hysterisis=100×ΔVh/VFS (%), wherein VFS denotes an output full-scale of the synchronization demodulation processing circuit, and ΔVh denotes a maximum output difference in a hysterisis loop, and a linearity is expressed as Linearity=100×ΔVr/VFS (%), wherein ΔVr denotes a maximum output deviation with respect to an ideal straight line of the torque detection sensitivity at the same torque value applied to the magnetostrictive shaft.

15. A magnetostrictive shaft comprising a shaft material, said shaft material having surface which is made of a magnetostrictive material as claimed in claim 14, wherein, when said magnetostrictive shaft having the Fe—Al alloy having the Aluminum content of 15 wt % is heated up to the predetermined temperature of about 500° C. for about two hours and wherein a positive torque and a negative torque of the magnetostrictive shaft give 3.166 and −3.299, the hysterisis characteristic is 1.6%, and the linearity is 13.9.

16. A magnetostrictive shaft comprising a shaft material, said shaft material having surface which is made of a magnetostrictive material as claimed in claim 11, which further comprises: a) a pair of first and second excitation and detection coils, each coil wound so as to face against the corresponding one of the magnetic anisotropy portions of the magnetostrictive shaft with a predetermined space; an oscillator oscillating an AC voltage having a predetermined oscillation frequency and a predetermined amplitude; a so bridge circuit having first, second, third, and fourth arms, said first arm having said first excitation and detection coil, said second arm having said second excitation and detection coil, said third and fourth arms having variable resistors, a first junction between the first and second arms being connected to an output end of said oscillator, a second and third junctions between the first and third arms being connected to first and second input ends of a differential amplifier, and an output end of said differential amplifier being connected to a first input end of a synchronization modulation processing circuit, a second input end of said synchronization modulation processing circuit being connected to the output end of said oscillator, an output voltage of said synchronization modulation processing circuit being previously set to zero according to the adjustment of either of said variable resistors when no torque is applied to said magnetostrictive shaft and wherein a torque detection sensitivity (V) is an output DC voltage level (E) of said synchronization modulation processing circuit, a hysterisis characteristic of the magnetostrictive type torque sensor is expressed as Hysterisis=100×ΔVh/VFS (%), wherein VFS denotes an output full-scale of the synchronization demodulation processing circuit, and ΔVh denotes a maximum output difference in a hysterisis loop, and a linearity is expressed as Linearity=100×ΔVr/VFS (%), wherein ΔVr denotes a maximum output deviation with respect to an ideal straight line of the torque detection sensitivity at the same torque value applied to the magnetostrictive shaft.

17. A magnetostrictive shaft comprising a shaft material, said shaft material having surface which is made of a magnetostrictive material as claimed in claim 16, wherein, when said magnetostrictive shaft having the Fe—Al alloy whose Aluminum content is 15 wt % is heated for about two hours up to the temperature of about 850° to give the B2 phase of the alloyed state of the Fe—Al alloy has a positive torque and negative torque of the torque detection sensitivity (V) is 1.340 and −1.310, respectively, the hysterisis is 0.5%, and the linearity is 4.8%.

18. A magnetostrictive shaft comprising a shaft material, said shaft material having surface which is made of a magnetostrictive material as claimed in claim 16, wherein, when said magnetostrictive shaft having the Fe—Al alloy whose Aluminum content is 15 wt % is heated for about two hours up to the temperature of about 600° to give the B2 phase of the alloyed state of the Fe—Al alloy has a positive torque and negative torque of the torque detection sensitivity (V) is 2.901 and −3.011, respectively, the hysterisis is 0.4%, and the linearity is 2.5%.

\* \* \* \* \*